US011810951B2

United States Patent
Peng et al.

(10) Patent No.: US 11,810,951 B2
(45) Date of Patent: Nov. 7, 2023

(54) SEMICONDUCTOR-ON-INSULATOR FIELD EFFECT TRANSISTOR WITH PERFORMANCE-ENHANCING SOURCE/DRAIN SHAPES AND/OR MATERIALS

(71) Applicant: GlobalFoundries U.S. Inc., Malta, NY (US)

(72) Inventors: Jianwei Peng, Clifton Park, NY (US); Hong Yu, Clifton Park, NY (US); Viorel Ontalus, Unionville, CT (US)

(73) Assignee: GlobalFoundries U.S. Inc., Malta, NY (US)

( * ) Notice: Subject to any disclaimer, the term of this patent is extended or adjusted under 35 U.S.C. 154(b) by 49 days.

(21) Appl. No.: 17/552,386

(22) Filed: Dec. 16, 2021

(65) Prior Publication Data
US 2023/0197783 A1   Jun. 22, 2023

(51) Int. Cl.
*H01L 29/08*   (2006.01)
*H01L 29/06*   (2006.01)
(Continued)

(52) U.S. Cl.
CPC ...... *H01L 29/0847* (2013.01); *H01L 29/0653* (2013.01); *H01L 29/66568* (2013.01); *H01L 29/7848* (2013.01); *H01L 29/78618* (2013.01)

(58) Field of Classification Search
CPC . H01L 29/0843–0886; H01L 29/66636; H01L 21/823418; H01L 21/823814;
(Continued)

(56) References Cited

U.S. PATENT DOCUMENTS 6,100,567 A   8/2000   Burr
6,339,244 B1   1/2002   Krivokapic
(Continued)

OTHER PUBLICATIONS

Krivokapic et al., "Manufacturability of 20-nm Ultrathin Body Fully Depleted SOI Devices With FUSI Metal Gates," IEEE Transactions on Semiconductor Manufacturing, vol. 18, No. 1, 2005, pp. 5-12.
(Continued)

*Primary Examiner* — Sonya McCall-Shepard
(74) *Attorney, Agent, or Firm* — Anthony Canale; Hoffman Warnick LLC

(57) ABSTRACT

Disclosed are a semiconductor structure and method of forming the structure. The structure includes a field effect transistor (FET) with a channel region between source/drain regions that extend through a semiconductor layer and into an insulator layer, that include a first portion in the insulator layer, and a second portion on the first portion in the semiconductor layer and, optionally, extending above the semiconductor layer. The first portion is relatively wide, includes a shallow section below the second portion, and a deep section adjacent to the channel region and overlayed by the semiconductor layer. The uniquely shaped first portion boosts saturation current to be boosted to allow the height of the second portion to be reduced to minimize overlap capacitance. Optionally, each source/drain region includes multiple semiconductor materials including a stress-inducing semiconductor material grown laterally from the semiconductor layer to improve charge carrier mobility in the channel region.

18 Claims, 13 Drawing Sheets

(51) Int. Cl.
 *H01L 29/66* (2006.01)
 *H01L 29/78* (2006.01)
 *H01L 29/786* (2006.01)

(58) Field of Classification Search
 CPC .......... H01L 29/7848; H01L 29/78618; H01L 29/78621; H01L 21/823412; H01L 21/82387; H01L 29/66492; H01L 29/7833; H01L 21/7624; H01L 21/76243; H01L 27/12; H01L 27/1203; H01L 29/107; H01L 29/1075; H01L 21/02035; H01L 21/302; H01L 21/306–30621; H01L 21/31053; H01L 21/31055; H01L 21/31056; H01L 21/311; H01L 21/31111; H01L 21/31116; H01L 21/31127; H01L 21/31144; H01L 21/3115–31155
 See application file for complete search history.

(56) References Cited

U.S. PATENT DOCUMENTS

| | | |
|---|---|---|
| 6,660,598 B2 | 12/2003 | Hanafi et al. |
| 6,841,831 B2 | 1/2005 | Hanafi et al. |
| 6,924,517 B2 | 8/2005 | Chen et al. |
| 7,060,546 B2 | 6/2006 | Hsu et al. |
| 7,198,993 B2 | 4/2007 | Tigelaar et al. |
| 7,745,879 B2 | 6/2010 | Bryant et al. |
| 7,932,136 B2 | 4/2011 | Hua et al. |
| 7,973,370 B2 | 7/2011 | Forbes |
| 8,012,820 B2 | 9/2011 | Majumdar et al. |
| 8,030,145 B2 | 10/2011 | Chang et al. |
| 8,937,354 B2 | 1/2015 | Chen et al. |
| 9,484,270 B2 | 11/2016 | Hook et al. |
| 10,535,662 B2 | 1/2020 | Chan et al. |
| 2003/0162358 A1 | 8/2003 | Hanafi et al. |
| 2005/0077564 A1 | 4/2005 | Forbes |
| 2005/0093067 A1 | 5/2005 | Yeo et al. |
| 2005/0093075 A1* | 5/2005 | Bentum ............ H01L 29/66636 257/E29.267 |
| 2011/0024840 A1 | 2/2011 | Khater |
| 2012/0205743 A1 | 8/2012 | Chen et al. |
| 2020/0135895 A1 | 4/2020 | Pandey et al. |

OTHER PUBLICATIONS

Paydavosi et al., "BSIM—SPICE Models Enable FinFET and UTB IC Designs," IEEE Access, vol. 1, 2013, pp. 201-215.

* cited by examiner

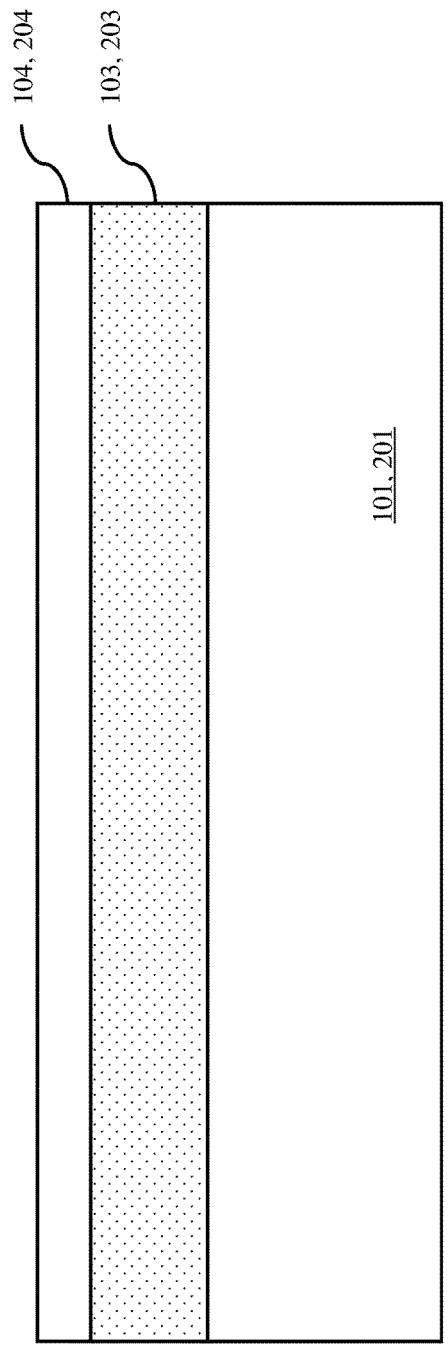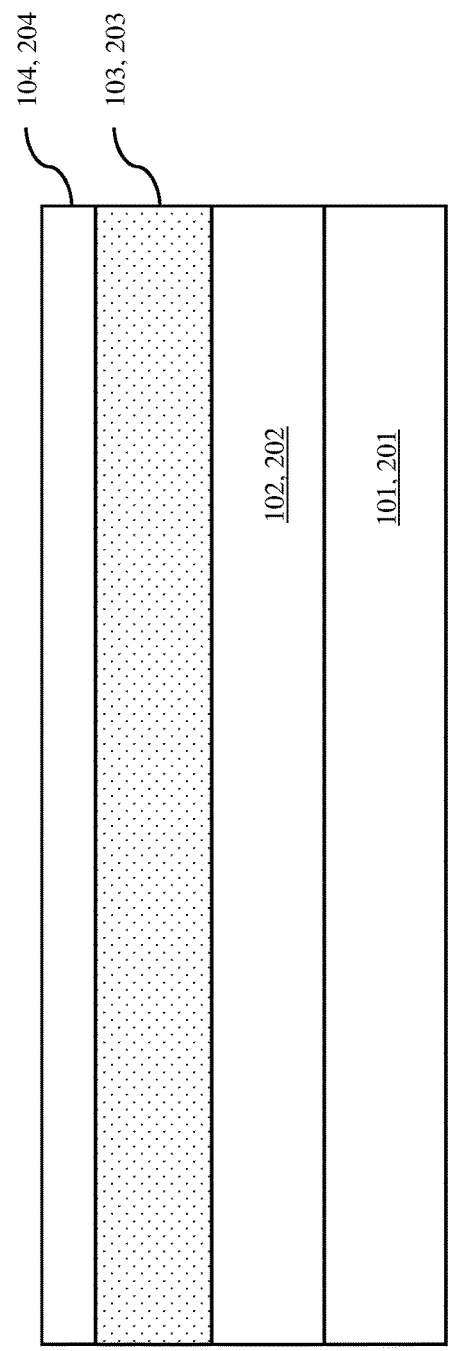
FIG. 4
FIG. 5

SEMICONDUCTOR-ON-INSULATOR FIELD EFFECT TRANSISTOR WITH PERFORMANCE-ENHANCING SOURCE/DRAIN SHAPES AND/OR MATERIALS

BACKGROUND

Field of the Invention

The present invention relates to field effect transistors (FETs) and, more particularly, to semiconductor-on-insulator FETs.

Description of Related Art

Key factors considered in modern integrated circuit design include, but are not limited to, performance improvement, size scaling, and power consumption. Oftentimes design changes with respect to one of these factors can result in an undesirable trade-off with respect to one or more of the other factors. For example, complementary metal oxide semiconductor (CMOS) designs have been developed using advanced semiconductor-on-insulator processing technology platforms (e.g., a fully-depleted silicon-on-insulator (FDSOI) processing technology platform), which include ultra-thin semiconductor and insulator layers (e.g., silicon and buried oxide layers) stacked on a base semiconductor substrate (e.g., a silicon substrate). Advantages of such designs include, but are not limited to, field effect transistor (FET) size scaling and optional back gate biasing to improve performance (e.g., forward back-biasing (FBB) or reverse back-biasing (RBB) for fine tuning FET threshold voltages (Vts). However, due to increased resistance from the ultra-thin semiconductor layer, raised source/drain regions are necessary to boost saturation current. Unfortunately, the raised source/drain regions result in a corresponding performance-degrading increase in overlap capacitance (Cov) between the raised source/drain regions and the gate structure.

SUMMARY

In view of the foregoing, disclosed herein are embodiments of a semiconductor structure including a planar semiconductor-on-insulator field effect transistor (FET). The FET can include a channel region positioned laterally between source/drain regions, which extend through a semiconductor layer and into an insulator layer and which, in order to enhance performance, have a unique shape and/or include a stress-inducing semiconductor material. Specifically, in some embodiments, each source/drain region can include a first portion in the insulator layer and a second portion in the semiconductor layer and, optionally, extending above the semiconductor layer. The first portion can be wider than the second portion and can include a relatively shallow section aligned below the second portion and a relatively deep section adjacent to the channel region and overlayed by the semiconductor layer. By including such a uniquely shaped first portion in the insulator layer (also referred to herein as an in-insulator first portion), the distance between source/drain regions and the channel region can be reduced without reducing spacer thickness (which would increase overlap capacitance (Cov)). Furthermore, saturation current can be boosted while optionally allowing the height of the second portion to be reduced in order to minimize Cov. In some embodiments, each source/drain region can include multiple semiconductor layers including one that is grown laterally from the semiconductor layer during processing and that is specifically a stress-inducing semiconductor material for improving charge carrier mobility in the channel region. In some embodiment, each source/drain region can include a combination of the above-described features. Also disclosed herein are method embodiments for forming the above-described semiconductor structure embodiments.

More particularly, disclosed herein are embodiments a semiconductor structure including a semiconductor-on-insulator field effect transistor (FET) configured for enhanced performance.

Some embodiments of the semiconductor structure can include a semiconductor substrate, an insulator layer on the semiconductor substrate, and a semiconductor layer on the insulator layer. The semiconductor structure can further include a transistor and, particularly, a field effect transistor (FET). The FET can include a channel region in the semiconductor layer. The FET can also include source/drain regions extending through the semiconductor layer and into the insulator layer such that the channel region is positioned laterally between the source/drain regions. Each source/drain region can include a first portion within the insulator layer and a second portion above the first portion within the semiconductor layer and, optionally, extending above the level of the top surface of the semiconductor layer. The first portion within the insulator layer can be wider than the second portion. Specifically, the first portion can have an end section adjacent to the channel region (i.e., proximal to the channel region) and an additional section positioned laterally adjacent to the end section (i.e., distal to the channel region). Optionally, the additional section can extend to a first depth within the insulator layer and the end section can extend to a second depth that is greater than the first depth. In any case, the semiconductor layer can extend laterally over the end section of the first portion of the source/drain region to the second portion of the source/drain region (i.e., can overlay the end section). By including such a uniquely shaped in-insulator first portion, the distance between source/drain regions and the channel region can be reduced without reducing spacer thickness (which would increase overlap capacitance (Cov)). Furthermore, saturation current can be boosted while optionally allowing the height of the second portion to be reduced in order to minimize Cov.

Other embodiments of the semiconductor structure can include a semiconductor substrate, an insulator layer on the semiconductor substrate, and a semiconductor layer on the insulator layer. The semiconductor structure can further include a transistor and, particularly, a field effect transistor (FET). The FET can include a channel region in the semiconductor layer. The FET can also include source/drain regions extending through the semiconductor layer and into the insulator layer such that the channel region is positioned laterally between the source/drain regions. Each source/drain region can include a first portion within the insulator layer and a second portion above the first portion within the semiconductor layer and, optionally, extending above the level of the top surface of the semiconductor layer. Each source/drain region can further include a first semiconductor material positioned laterally immediately adjacent to the semiconductor layer and the insulator layer (i.e., in the second portion and the first portion, respectively. The first semiconductor material can be a stress-inducing semiconductor material configured to improve charge carrier mobility within the channel region. Each source/drain region can also include a second semiconductor material on and different from the first semiconductor material at least in the second portion.

Still other embodiments of the semiconductor structure can include a combination of the features from the above-described semiconductor structure embodiments including the uniquely shaped in-insulator first portion and the stress-inducing semiconductor material.

Also disclosed herein are method embodiments for forming the above-described semiconductor structure embodiments.

The method embodiments can include accessing an initial semiconductor structure that includes a semiconductor layer on an insulator layer. The method embodiments can further include using this initial semiconductor structure to form a field effect transistor (FET), as described above with regard to the various different semiconductor structure embodiments. Specifically, the FET can be formed such that it includes a channel region in the semiconductor layer and source/drain regions extending through the semiconductor layer and into the insulator layer such that the channel region is positioned laterally between the source/drain regions. Each source/drain region can include a first portion within the insulator layer and a second portion above the first portion within the semiconductor layer and, optionally, extending above the level of the top surface of the semiconductor layer.

Some method embodiments can include forming the source/drain regions of the FET such that the first portion within the insulator layer is wider than the second portion, has an end section adjacent to the channel region (i.e., proximal to the channel region), and an additional section positioned laterally adjacent to the end section (i.e., distal to the channel region). Optionally, the additional section can extend to a first depth within the insulator layer and the end section can extend to a second depth that is greater than the first depth. In any case, the semiconductor layer can extend laterally over the end section to the second portion of the source/drain region (i.e., can overlay the end section). By including such a uniquely shaped in-insulator first portion, the distance between source/drain regions and the channel region can be reduced without reducing spacer thickness (which would increase overlap capacitance (Cov)). Furthermore, saturation current can be boosted while optionally allowing the height of the second portion to be reduced in order to minimize Cov.

Other method embodiments can include forming the source/drain regions of the FET such that the first portion within the insulator layer isn't wider than that second portion. In these method embodiments, multiple semiconductor materials can be used to form the source/drain regions including a first semiconductor material positioned laterally adjacent to the semiconductor layer and a second semiconductor material on the first semiconductor material. The first semiconductor material can specifically be a stress-inducing semiconductor material for improving charge carrier mobility in the channel region.

Still other method embodiments can include forming the source/drain regions with a combination of the features described above including the uniquely shaped in-insulator first portion and the stress-inducing semiconductor material.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 4 is a cross-section diagram illustrating a partially completed semiconductor structures formed according to the flow diagram of FIG. 3;

FIG. 5 is a cross-section diagram illustrating a partially completed semiconductor structures formed according to the flow diagram of FIG. 3;

DETAILED DESCRIPTION

As mentioned above, advantages of complementary metal oxide semiconductor (CMOS) designs in advanced semiconductor-on-insulator technology platforms (e.g., a fully-depleted silicon-on-insulator technology platform) include, but are not limited to, field effect transistor (FET) size scaling and optional back gate biasing to improve performance (e.g., forward back-biasing (FBB) or reverse back-biasing (RBB) for fine tuning FET threshold voltages (Vts). However, due to increased resistance from the ultra-thin semiconductor layer, raised source/drain regions are necessary to boost saturation current. Unfortunately, the raised source/drain regions result in a corresponding performance-degrading increase in overlap capacitance (Cov) between the raised source/drain regions and the gate structure.

In view of the foregoing, disclosed herein are embodiments of a semiconductor structure including a planar semiconductor-on-insulator field effect transistor (FET). The FET can include a channel region positioned laterally between source/drain regions, which extend through a semiconductor layer and into an insulator layer and which, in order to enhance performance, have a unique shape and/or include a stress-inducing semiconductor material. Specifically, in some embodiments, each source/drain region can include a first portion in the insulator layer and a second portion in the semiconductor layer and, optionally, extending above the semiconductor layer. The first portion can be wider than the second portion and can include a relatively shallow section aligned below the second portion and a relatively deep section adjacent to the channel region and overlayed by the semiconductor layer. By including such a uniquely shaped first portion in the insulator layer (also referred to herein as an in-insulator first portion), the distance between source/drain regions and the channel region can be reduced without reducing spacer thickness (which would increase overlap capacitance (Cov)). Furthermore, saturation current can be boosted while optionally allowing the height of the second portion to be reduced in order to minimize Cov. In some embodiments, each source/drain region can include multiple semiconductor layers including one that is grown laterally from the semiconductor layer during processing and that is specifically a stress-inducing semiconductor material for improving charge carrier mobility in the channel region. In some embodiment, each source/drain region can include a combination of the above-described features. Also disclosed herein are method embodiments for forming the above-described semiconductor structure embodiments.

Figure 1A:
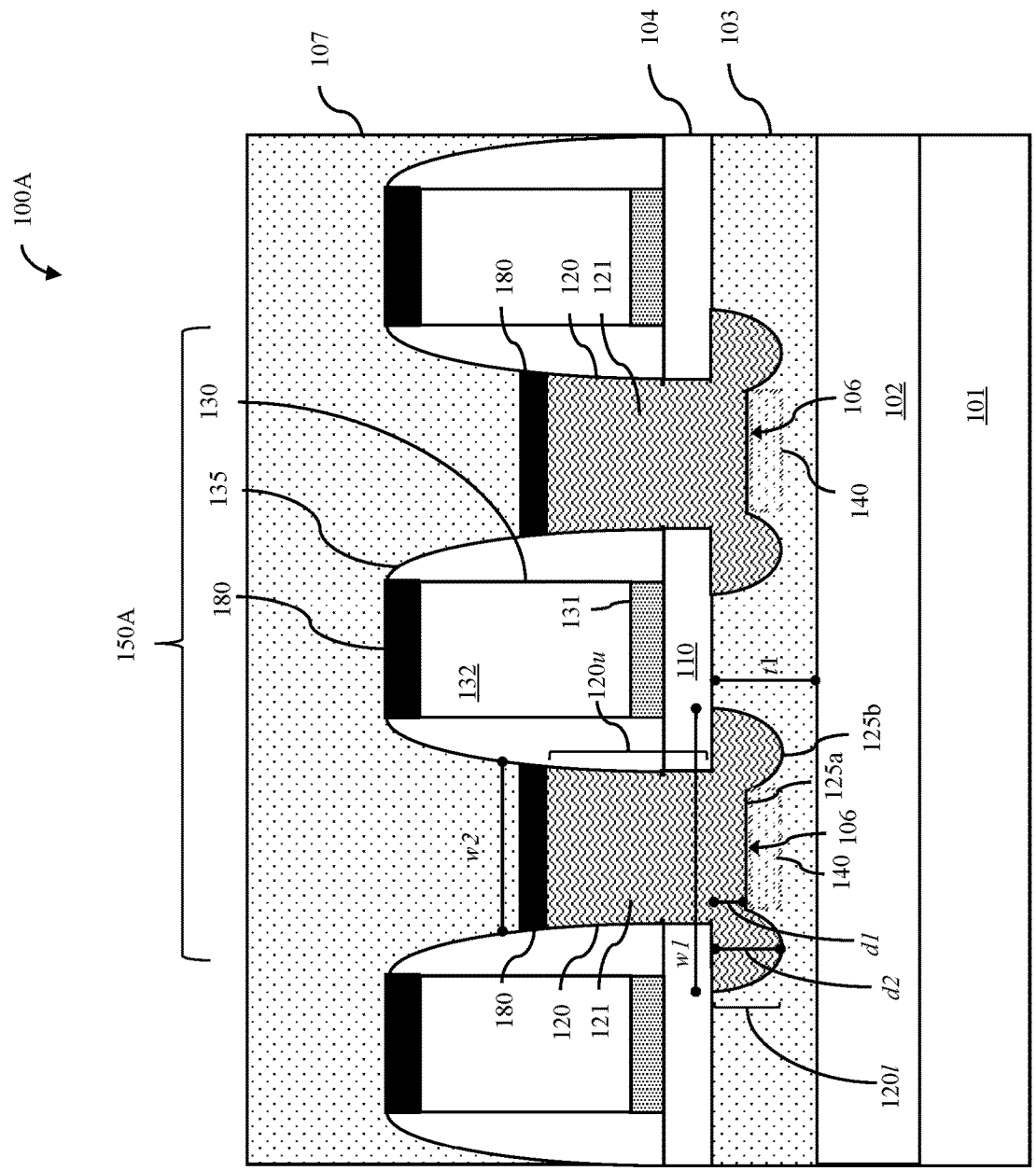
FIGS. 1A and 1B are cross-section diagrams illustrating different semiconductor structure embodiments including a semiconductor-on-insulator field effect transistor (FET)
Figure 1B:
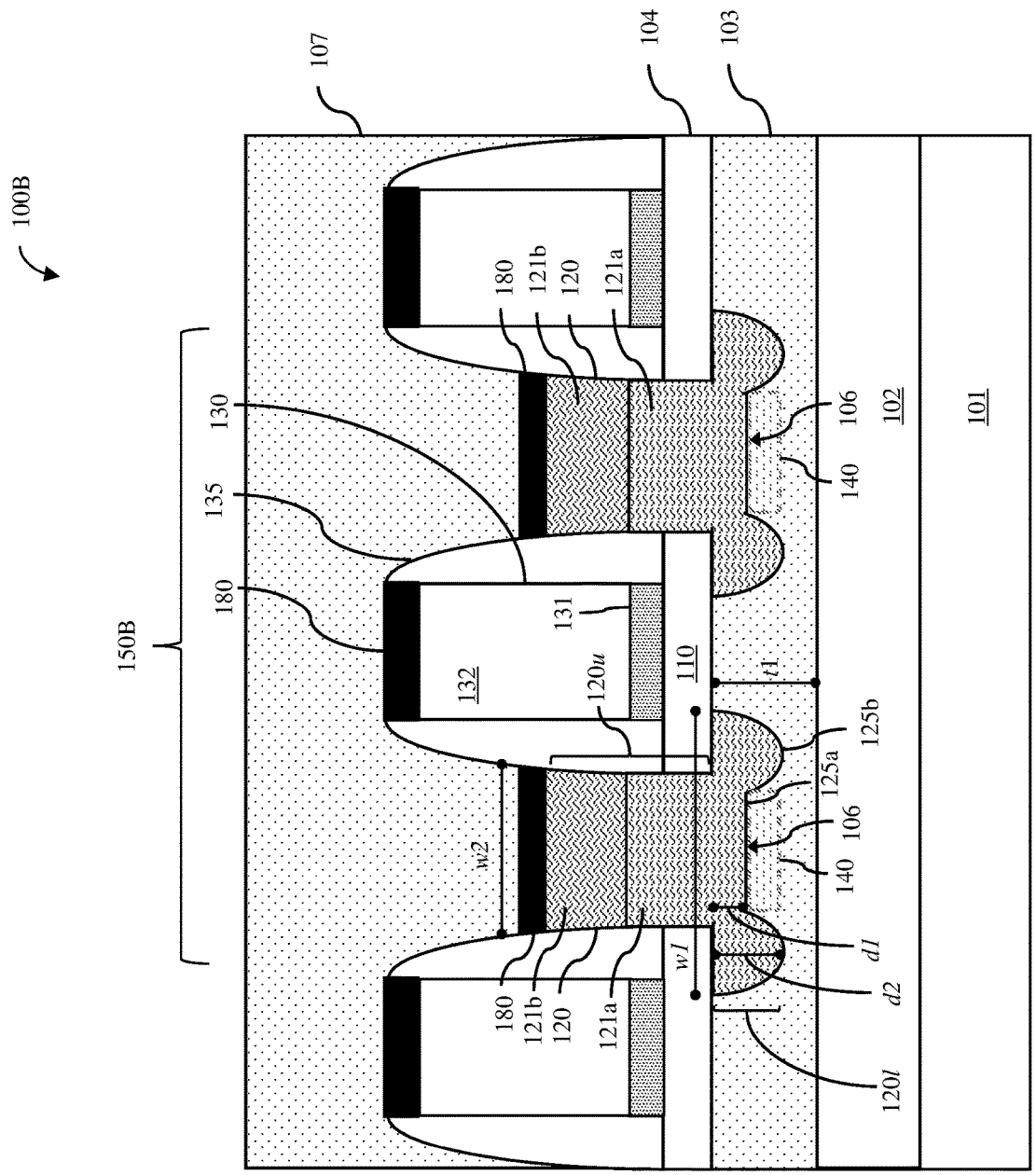
Figure 2:
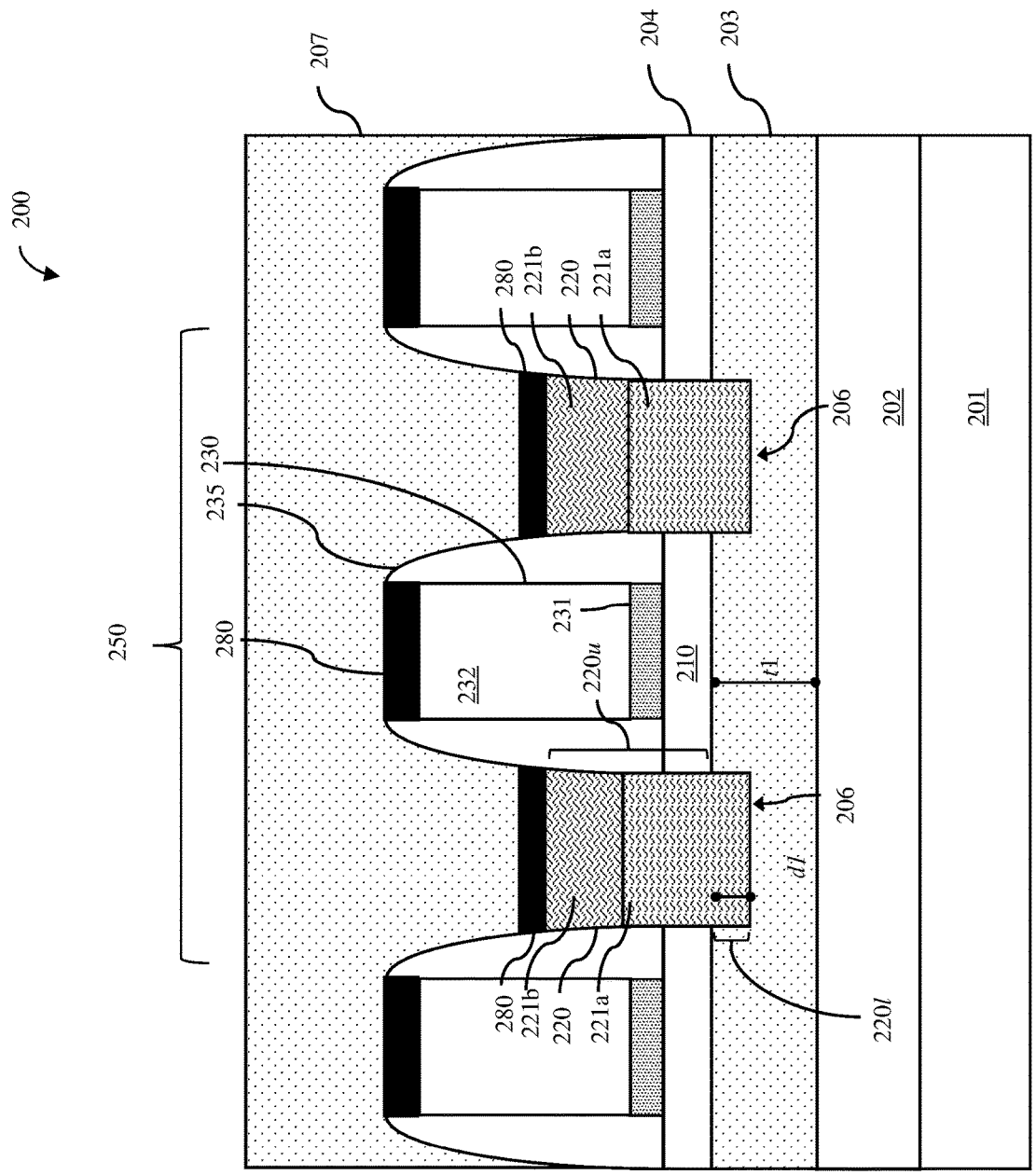
FIG. 2 is a cross-section diagram illustrating another semiconductor structure embodiment including a semiconductor-on-insulator field effect transistor (FET)

More particularly, referring to FIGS. 1A, 1B and 2, disclosed herein are embodiments a semiconductor structure 100A, 100B, 200 including a semiconductor-on-insulator field effect transistor (FET) 150A, 150B, 250, respectively, with source/drain regions 120, 220 having a unique shape and/or including a stress-inducing semiconductor material in order to enhance performance.

The semiconductor structure 100A, 100B, 200 can include a monocrystalline semiconductor substrate 101, 201. The semiconductor structure 100A, 100B, 200 can further include an insulator layer 103, 203 on the semiconductor substrate 101, 201 and a monocrystalline semiconductor layer 104, 204 on the insulator layer 103, 203. In this case, the monocrystalline semiconductor substrate 101, 201 can be a monocrystalline silicon substrate. The insulator layer 103, 203 can be a silicon dioxide layer (also referred to herein as a buried oxide layer that is relatively thin (e.g., 50 nm or less). The monocrystalline semiconductor layer 104, 204 can be a monocrystalline silicon layer or some other suitable monocrystalline semiconductor layer (e.g., a monocrystalline silicon germanium layer) that is also relatively thin (e.g., 22 nm or less).

The semiconductor structure 100A, 100B, 200 can, for example, be formed using an advanced semiconductor-on-insulator technology platform (e.g., a fully-depleted silicon-on-insulator (FDSOI) technology platform). Those skilled in the art will recognize that, in advanced semiconductor-on-insulator technology platforms such as in the FDSOI technology platform, a semiconductor structure is typically formed on a hybrid semiconductor substrate. Such a hybrid semiconductor substrate typically includes a base semiconductor substrate, which is monocrystalline in structure, and both semiconductor-on-insulator regions (e.g., SOI regions) and bulk semiconductor regions (also referred to as hybrid semiconductor regions) on the base semiconductor substrate. Each semiconductor-on-insulator region includes a monocrystalline semiconductor layer on an insulator layer above the base semiconductor substrate. Each bulk semiconductor region includes a monocrystalline epitaxial semiconductor layer (e.g., a monocrystalline silicon layer) immediately adjacent to the top surface of the base semiconductor substrate. Top surfaces of the epitaxial semiconductor layers in the bulk semiconductor regions and top surface of SOI layers in the semiconductor-on-insulator regions can be essentially co-planar. Alternatively, top surfaces of epitaxial semiconductor layers in the bulk semiconductor regions can be somewhat above or below the level of the top surface of SOI layers in the semiconductor-on-insulator regions. Those skilled in the art will recognize that in advanced semiconductor-on-insulator technology platforms (e.g., the fully-depleted silicon-on-insulator (FDSOI) technology platform) the semiconductor-on-insulator regions are typically used as devices regions (e.g., for fully-depleted planar field effect transistors (FET)). Bulk semiconductor regions can provide a means for accessing well regions below the device regions so that the well regions can be selectively biased (e.g., forward back biasing (FBB) or reverse back biasing (RBB) to adjust the threshold voltages (Vts) of the above FETs). Bulk semiconductor regions can also be used as additional device regions. Since the present invention is directed to a FET structure, such bulk semiconductor regions have been omitted from the drawings to avoid clutter and allow the reader to focus on the salient aspects of the disclosed embodiments.

The semiconductor structure 100A, 100B, 200 can further include a transistor and, particularly, a planar field effect transistor (FET) 150A, 150B, and 250 located within a semiconductor-on-insulator region. The FET 150A, 150B, 250 can be either an N-type field effect transistor (NFET) or a P-type field effect transistor (PFET), as discussed below.

The FET 150A, 150B, 250 can include source/drain regions 120, 220 and a channel region 110, 210 positioned laterally between source/drain regions 120, 220. In the case of an NFET, the channel region 110, 210 can be undoped or low doped so as to have P− conductivity at a relatively low conductivity level and the source/drain regions 120, 220 can be doped so as to have N-type conductivity at a relatively high conductivity level (e.g., so as to be N+ source/drain regions). In the case of a PFET, the channel region 110, 210 can be undoped or low doped so as to have N− conductivity at a relatively low conductivity level and the source/drain regions 120, 220 can be doped so as to have P-type conductivity at a relatively high conductivity level (e.g., so as to be P+ source/drain regions). The FET 150A, 150B, 250 can further include a gate structure 130, 230 on the channel region 110, 210.

More specifically, the FET 150A, 150B, 250 can include a channel region 110, 210 in the semiconductor layer 104, 204. The semiconductor layer 104, 204 and, thereby the channel region 110, 210 can be undoped (i.e., intrinsic semiconductor material). Alternatively, the semiconductor layer 104, 204 and, thereby the channel region 110, 210 can be a low doped region. For example, in the case of an NFET, the channel region 110, 210 could be an undoped channel region or, alternatively, a P− channel region, whereas in the case of a PFET, the channel region 110, 210 could be an undoped channel region or an N− channel region.

The FET 150A, 150B, and 250 can further include a gate structure 130, 230 on the semiconductor layer 104, 204 aligned above the channel region 110, 210. The gate structure 130, 230 can include a gate stack with opposing sidewalls. The gate stack can include a gate dielectric layer 131, 231 immediately adjacent to the semiconductor layer 104, 204 and a gate conductor layer 132, 232 on the gate dielectric layer 131, 231. Dielectric gate sidewall spacers 135, 235 can be positioned laterally adjacent to the opposing sidewalls of the gate stack. The dielectric gate sidewall spacers 135, 235 can be made of a dielectric material that is sufficiently different from the insulator layer 103, 203 so as to allow selective etching of the insulator layer 103, 203 during processing. Thus, for example, if the insulator layer 103, 203 is a silicon dioxide layer, then the dielectric gate sidewall spacers 135, 235 can be made of silicon nitride, silicon oxynitride, or some other suitable dielectric material different from silicon dioxide.

The FET 150A, 150B, and 250 can also include source/drain regions 120, 220 extending through the semiconductor layer 104, 204 and into the insulator layer 103, 203 such that the channel region 110, 210 is positioned laterally between the source/drain regions 120, 220. Specifically, source/drain trenches 106, 206 can extend vertically through the semiconductor layer 104, 204 into the insulator layer 103, 203 such that each source/drain trench includes a first portion (also referred to herein as a lower portion), which extends into, but not completely through, the insulator layer 103, 203, and a second portion (also referred to herein as an upper portion), which extends completely through the semiconductor layer 104, 204 and which is aligned above the first portion.

Each source/drain region 120, 220 can include one or more layers of in situ doped epitaxial semiconductor material that fill and, optionally, overfill the source/drain trenches 106, 206. As mentioned above, the source/drain regions 120, 220 can be N+ source/drain regions for an NFET or P+ source/drain regions for a PFET. In either case, each source/drain region 120, 220 can include a first portion 120l, 220l (also referred to herein as a lower portion), which fills the first portion of the source/drain trench 106, 206 within the insulator layer 103, 203, and a second portion 120u, 220u (also referred to as an upper portion), which is above the first portion 120l, 220l, which completely fills the second portion of the source/drain trench 106, 206 within the semiconductor layer 104, 204, and which, optionally, overfills the second portion of the source/drain trench 106, 206 so as to extend vertically above the level of the top surface of the semiconductor layer 104, 204 and be positioned laterally adjacent to a gate sidewall spacer. If the second portions 120u of the source/drain regions 120 extend above the level of the top surface of the semiconductor layer 104, 204, the FET is considered to have raised source/drain regions.

In some embodiments of the semiconductor structure and, particularly, in the semiconductor structure 100A of FIG. 1A and the semiconductor structure 100B of FIG. 1B, the first portion of each source/drain trench 106 can be wider than the second portion of that source/drain trench 106. Thus, the first portion 120l of each source/drain region 120 can have a first width (w1) and the second portion 120u of each source/drain region 120 can have a second width (w2) that is less than the first width (w1). In this case, the first portion 120l of each source/drain region 120 can have an end section 125b and an additional section 125a positioned laterally adjacent to the end section 125b. The end section 125b can be adjacent to (i.e., proximal to) the channel region 110 and the semiconductor layer 104 can extend laterally over (i.e., can overlay) the end section 125b to the second portion 120u of the source/drain region 120. The length of the end section 125b can vary. For example, the end section 125b can extend laterally below only a portion of the gate sidewall spacer. Alternatively, the end section 125b could extend laterally below the entire gate sidewall spacer to the gate stack. Alternatively, the end section 125b could extend laterally below the entire gate sidewall spacer and further below a portion of the gate stack. The additional section 125a can be aligned below and immediately adjacent to the second portion 120u of the source/drain region 120.

Optionally, the additional section 125a can be positioned laterally between a pair of end sections that undercut semiconductor layers below adjacent gate structures (e.g., of adjacent FETs), as illustrated. Alternatively, the additional section 125a can be positioned laterally between a shallow trench isolation (STI) region (not shown) and the end section 125b.

Also, optionally, the additional section 125a can extend to a first depth (d1) into the insulator layer 103 (e.g., as measured from the top surface of the insulator layer), the end section 125b can extend to a second depth (d2) into the insulator layer 103, and the second depth (d2) can be greater than the first depth (d1).

It should be noted that etch stop regions 140 can be within the insulator layer 103 aligned below the additional sections 125a of the first portions 120l of the source/drain regions 120. The etch stop regions 140 can be dopant implant regions doped with an inert dopant. This inert dopant can be selected to sufficiently change the etch characteristics of the etch stop region 140 relative to the remainder of the insulator layer 103 so that the adjacent areas of the insulator layer 103 can be selectively etched away without significantly etching away the etch stop region during source/drain trench formation. Additionally, this inert dopant can be selected so that the electrical characteristics of the etch stop regions 140 are not significantly different from the electrical characteristics of the remainder of the insulator layer. In some exemplary embodiments, the inert dopant can be helium, carbon or nitrogen.

By including source/drain regions 120 having the uniquely shaped in-insulator first portion 120l in the FET 150A of the semiconductor structure 100A of FIGS. 1A and 1n the FET 150B of the semiconductor structure 100B of FIG. 1B, the distance between source/drain regions and the channel region can be reduced without reducing spacer thickness (which would increase overlap capacitance (Cov)). Furthermore, saturation current can be boosted while optionally allowing the height of the second portion to be reduced in order to minimize Cov.

In other embodiments of the semiconductor structure and, particularly, in the semiconductor structure 200 of FIG. 2, the first and second portions of each source/drain trench 206 may have essentially the same width or the first portion may be slightly tapered relative to the second portion. Thus, the first and second portions 220l-220u of each source/drain region 220 may have essentially the same width or the first portion 220l may be slightly tapered relative to the second portion 220u. In this case, saturation current can be boosted to a lesser extent simply by including the in-insulator first portion 220l, thus, optionally allowing the height of the second portion 220u to be reduced at least to some extent in order to reduce overlap capacitance (Cov).

As mentioned above, each source/drain region 120, 220 can include one or more layers of in situ doped epitaxial semiconductor material that fill and, optionally, overfill the source/drain trenches 106, 206. In some embodiments, each source/drain region 120 can include a single layer of monocrystalline semiconductor material 121, which is in situ doped and selectively epitaxially grown from an exposed vertical surface of the semiconductor layer 104 during processing (i.e., laterally grown) so as to completely fill and, optionally, overfill a corresponding source/drain trench (e.g., see the FET 150A in the semiconductor structure 100A of FIG. 1A). The semiconductor material 121 can be, for example, monocrystalline silicon or any other suitable monocrystalline semiconductor material.

In other embodiments, each source/drain region 120, 220 can include multiple monocrystalline layers of different semiconductor materials and, more particularly, a monocrystalline layer of a first semiconductor material 121a, 221a, which is in situ doped and selectively epitaxially grown from an exposed vertical surface of the semiconductor layer 104, 204 during processing (i.e., laterally grown), and a monocrystalline layer of a second semiconductor material 121b, 221b, which is different from the first semiconductor material 121a, 221a, which is in situ doped and selectively epitaxially grown on the first semiconductor material 121a, 221a, and which is at least in the second portion 120u, 220u of the source/drain region 120, 220. The first semiconductor material 121a, 221a can, for example, be a stress-inducing semiconductor material configured to improve charge carrier mobility within the channel region 110, 210. In the case of an NFET, the first semiconductor material 121a, 221a could be a tensile stress-inducing semiconductor material configured to improve electron mobility within the channel region 110, 210. Such a tensile stress-inducing semiconductor material could be, for example, silicon carbide or some other suitable tensile stress-inducing semiconductor material. In the case of a PFET, the first semiconductor material 121a, 221a could be a compressive stress-inducing semiconductor material configured to improve hole mobility within the channel region 110, 210. Such a compressive stress-inducing semiconductor material could be, for example, silicon germanium or some other suitable tensile stress-inducing semiconductor material. In any case, the second semiconductor material 121b, 221b could be silicon or some other suitable semiconductor material.

Optionally, the semiconductor structure 100A, 100B, 200 can further include a well region 102, 202 within the semiconductor substrate 101, 210 adjacent to the insulator layer 103, 203. As mentioned above, in FDSOI technology platforms, a well region below a FET can be accessed through a bulk semiconductor region and can be employed for reverse back biasing (RBB) or forward back biasing (FBB) in order to finely tune the FET threshold voltage. Those skilled in the art will recognize that the conductivity type (e.g., P-type or N-type) of the well region 102, 202 can be varies depending upon the conductivity type of the FET (e.g., whether the FET is an NFET or a PFET) and further based on whether the FET is to be a regular threshold voltage (RVT) FET, high threshold voltage (HVT), super low threshold voltage (SLVT) FET or low threshold voltage (LVT) FET.

Optionally, the semiconductor structure 100A, 100B, 200 can further include metal silicide layers 180, 280 on the source/drain regions 120, 220 and optionally on the gate structure 130, 230. Such silicide layers 180, 280 could be, for example, CoSi, NiSi, WSi, TiSi, or any other suitable metal silicide material layer.

Figure 3:
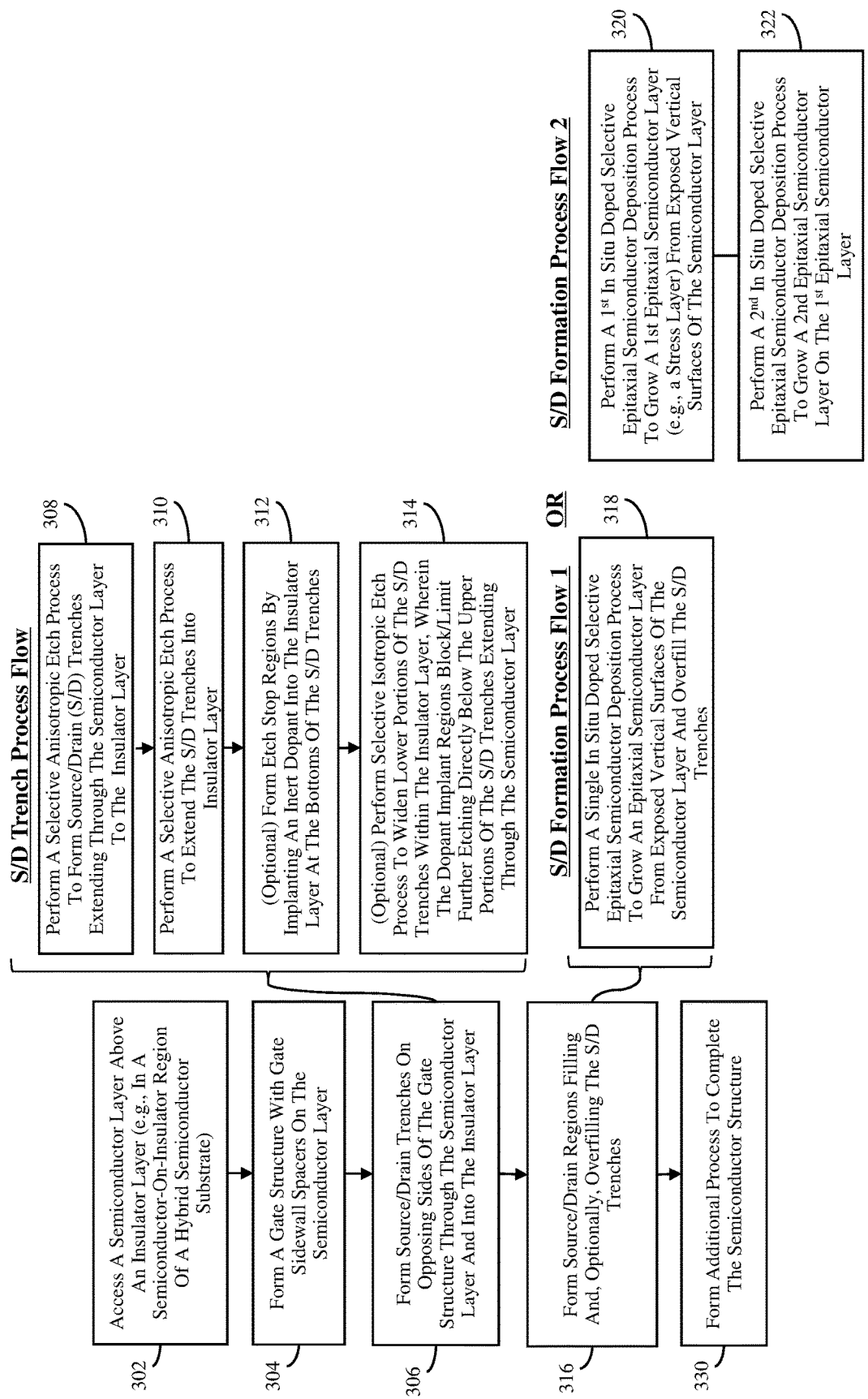
FIG. 3 is a flow diagram illustrating method embodiments for forming the disclosed semiconductor structure embodiments.

Referring to the flow diagram of FIG. 3, disclosed herein are method embodiments for forming semiconductor structures, such as the semiconductor structures 100A of FIG. 1A, 100B of FIG. 1B or 200 of FIG. 2, which include a planar semiconductor-on-insulator field effect transistor (FET) with a channel region positioned laterally between source/drain regions that extend through a semiconductor layer and into an insulator layer and that, in order to enhance performance, have a unique shape and/or include a stress-inducing semiconductor material.

The method embodiments can include accessing an initial semiconductor structure (see process 302 and FIG. 4). This initial semiconductor structure can include a monocrystalline semiconductor substrate 101, 201, an insulator layer 103, 203 on the semiconductor substrate 101, 201, and a monocrystalline semiconductor layer 104, 204 on the insulator layer 103, 203. The monocrystalline semiconductor substrate 101, 201 can be, for example, a monocrystalline silicon substrate. The insulator layer 103, 203 can be a silicon dioxide layer (also referred to herein as a buried oxide layer) that is relatively thin (e.g., 50 nm or less). The monocrystalline semiconductor layer 104, 204 can be a monocrystalline silicon layer or some other suitable monocrystalline semiconductor layer (e.g., a monocrystalline silicon germanium layer) that is also relatively thin (e.g., 22 nm or less). Optionally, this initial semiconductor structure can be a semiconductor-on-insulator region of a hybrid semiconductor substrate designed for fully-depleted silicon-on-insulator (FDSOI) structures, as discussed in greater detail above with regard to the structure embodiments.

The method embodiments can further include using this initial semiconductor structure to form a planar semiconductor-on-insulator field effect transistor (FET). The semiconductor layer 104, 204 can remain undoped in a designated channel region 110, 210. Alternatively, the semiconductor layer 104, 204 can be low doped (e.g., P− doped for an NFET and N− for a PFET). Optionally, a well region 102, 202 can further be formed in the semiconductor substrate 101 using a conventional dopant implant process (see FIG. 5). As mentioned above, in FDSOI technology platforms, a well region below a FET can be accessed through a bulk semiconductor region and can be employed for reverse back biasing (RBB) or forward back biasing (FBB) in order to finely tune the FET threshold voltage. Those skilled in the art will recognize that the conductivity type (e.g., P-type or N-type) of the well region 102, 202 can be varies depending upon the conductivity type of the FET (e.g., whether the FET is an NFET or a PFET) and further based on whether the FET is to be a regular threshold voltage (RVT) FET, high threshold voltage (HVT), super low threshold voltage (SLVT) FET or low threshold voltage (LVT) FET.

Figure 6:
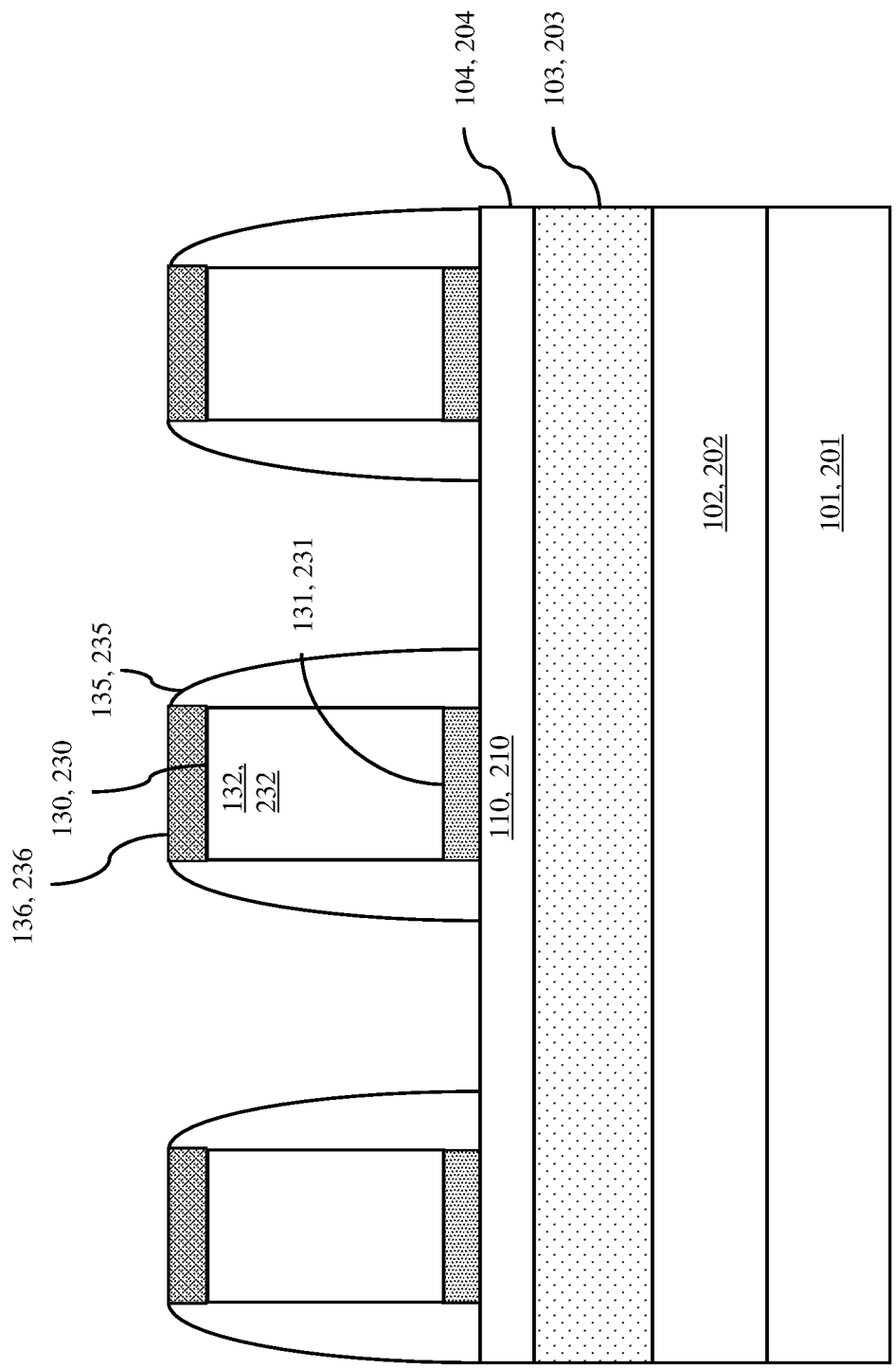
FIG. 6 is a cross-section diagram illustrating a partially completed semiconductor structures formed according to the flow diagram of FIG. 3.

A gate structure 130, 230 with dielectric gate sidewall spacers 135, 235 can be formed on the top surface of the semiconductor layer 104, 204 (see process 304 and FIG. 6). For gate first processing, one or more gate dielectric layers 131, 231 can be formed onto the semiconductor layer 104 and one or more gate conductor layers 132, 232 can be formed above the gate dielectric layer(s) 131, 231. A dielectric gate cap layer 136, 236 (e.g., a silicon nitride cap layer) can be formed on the gate conductor layer(s) 132, 232. These gate layers can subsequently be lithographically patterned and etched to form a gate structure 130, 230 with a gate cap 136, 236 on the semiconductor layer 104, 204 above a channel region 110, 210. For replacement metal gate (RMG) processing, a sacrificial gate structure could instead be formed at process 304 and replaced during subsequent processing. In any case, dielectric gate sidewall spacers 135, 235 can be formed on opposing sidewalls of the gate structure using convention sidewall spacer formation techniques. That is, a conformation sidewall spacer material layer can be deposited over the gate structure and an anisotropic etch process can be performed to remove portions of the sidewall spacer material layer from horizontal surfaces, leaving it intact as sidewall spacers on essentially vertical surfaces. It should be noted that the sidewall spacer material should be sufficiently different from the material of the insulator layer 103, 203 so as to allow selective etching of the insulator layer 103, 203 during subsequent processing. Thus, for example, if the insulator layer 103, 203 is a silicon dioxide layer, then the sidewall spacer material layer could be silicon nitride, silicon oxynitride, or some other suitable dielectric material different from silicon dioxide.

Figure 7A:
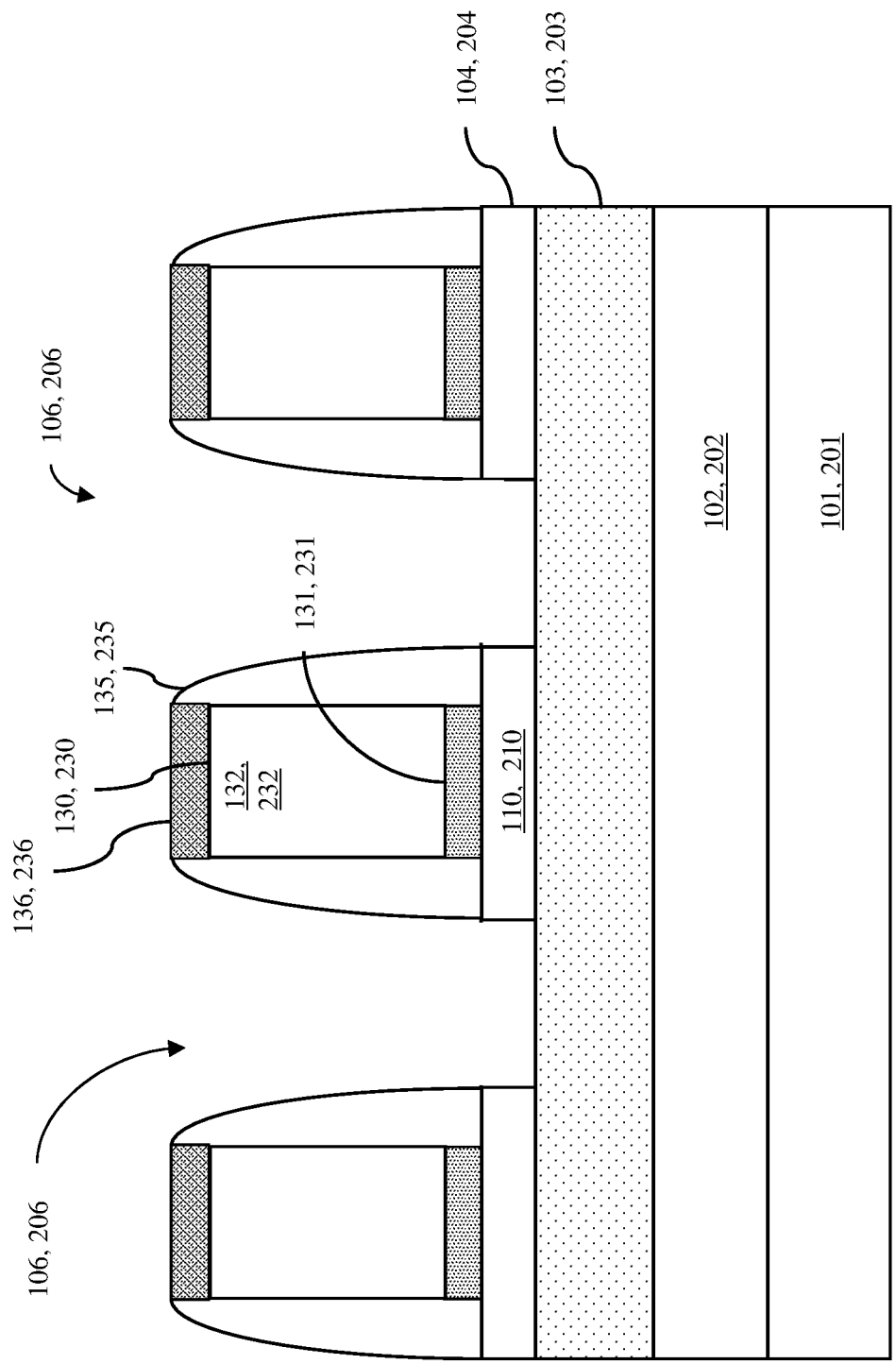
FIGS. 7A-7D are cross-section diagram illustrating partially completed semiconductor structures formed according to the flow diagram of FIG. 3 with FIGS. 7A-7B showing processes employed during source/drain trench formation for the semiconductor structures of FIGS. 1A, 1B and 2 and with FIGS. 7C-7D showing additional processes employed during source/drain trench formation for the semiconductor structures of FIGS. 1A and 1B only.

Source/drain trenches 106, 206, which extend completely through the semiconductor layer 104, 204 and into the insulator layer 103, 203, can be formed on opposing sides of the gate structure (see process 306). For example, a first selective anisotropic etch process can be performed in order to form initial source/drain trenches 106, 206 that extend completely through the semiconductor layer 104, 204 to the top surface of the insulator layer 103, 203 (see process 308 and FIG. 7A). Next, a second selective anisotropic etch process can be performed in order to extend the source/drain trenches 106, 206 some depth (d) into the insulator layer 103, 203 without extending completely through the insulator layer 103, 203 and exposing the semiconductor substrate 101, 201 (see process 310 and FIG. 7B). Thus, each source/drain trench 106, 206 has a first portion 720*l* (also referred to herein as a lower portion) within the insulator layer 103, 203 and a second portion 720*u* (also referred to herein as an upper portion) above the first portion 720*l* and extending through the semiconductor layer 104, 204.

Figure 7B:
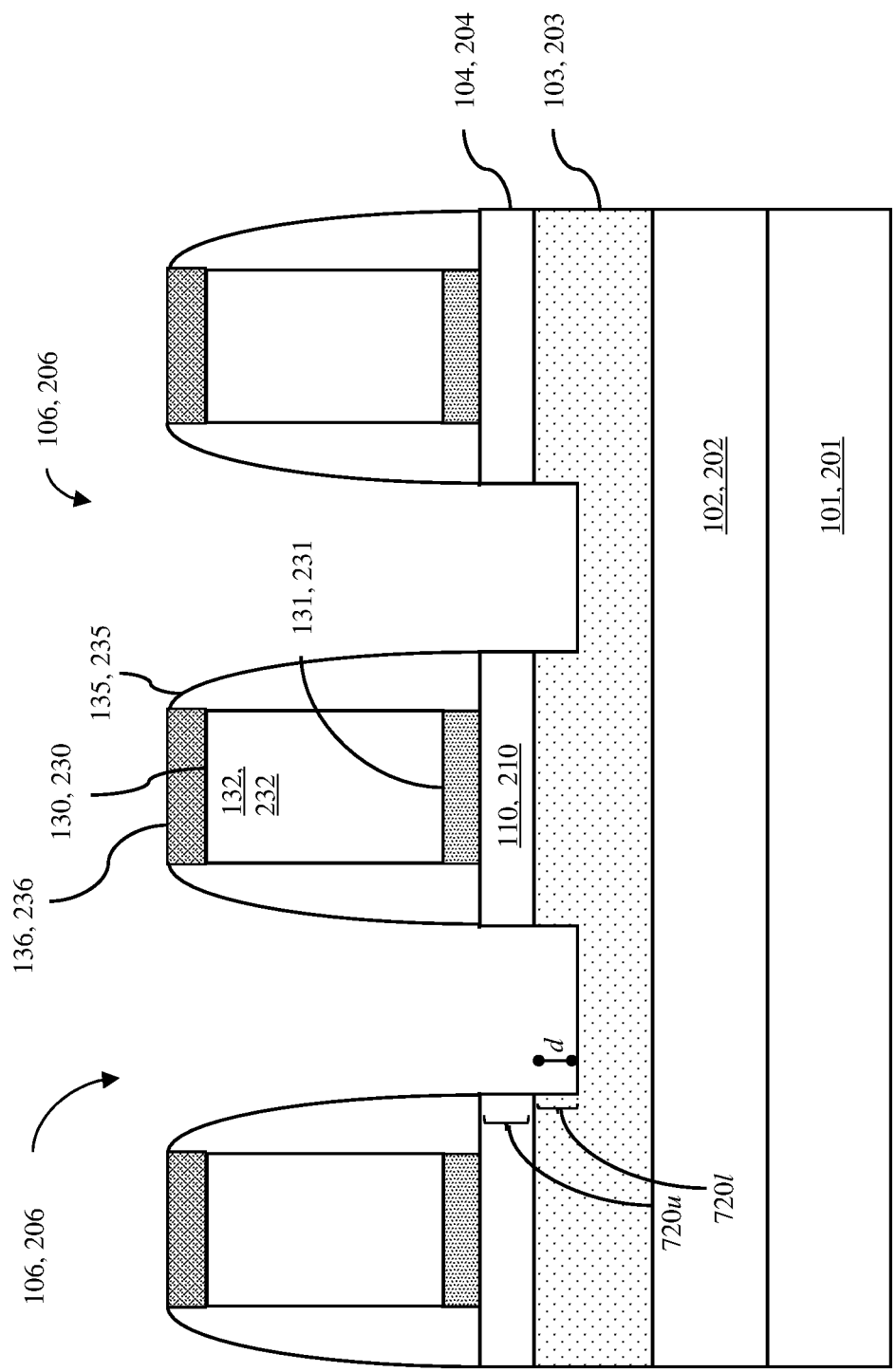

In some embodiments and, particularly, during formation of the semiconductor structure 200 of FIG. 2, formation of the source/drain trenches 206 can be complete following the second selective anisotropic etch process shown in FIG. 7B. Thus, in these embodiments, the first portion 720*l* of each source/drain trench 206 is essentially the same width as or slightly tapered relative to the second portion 720*u*.

Figure 7C:
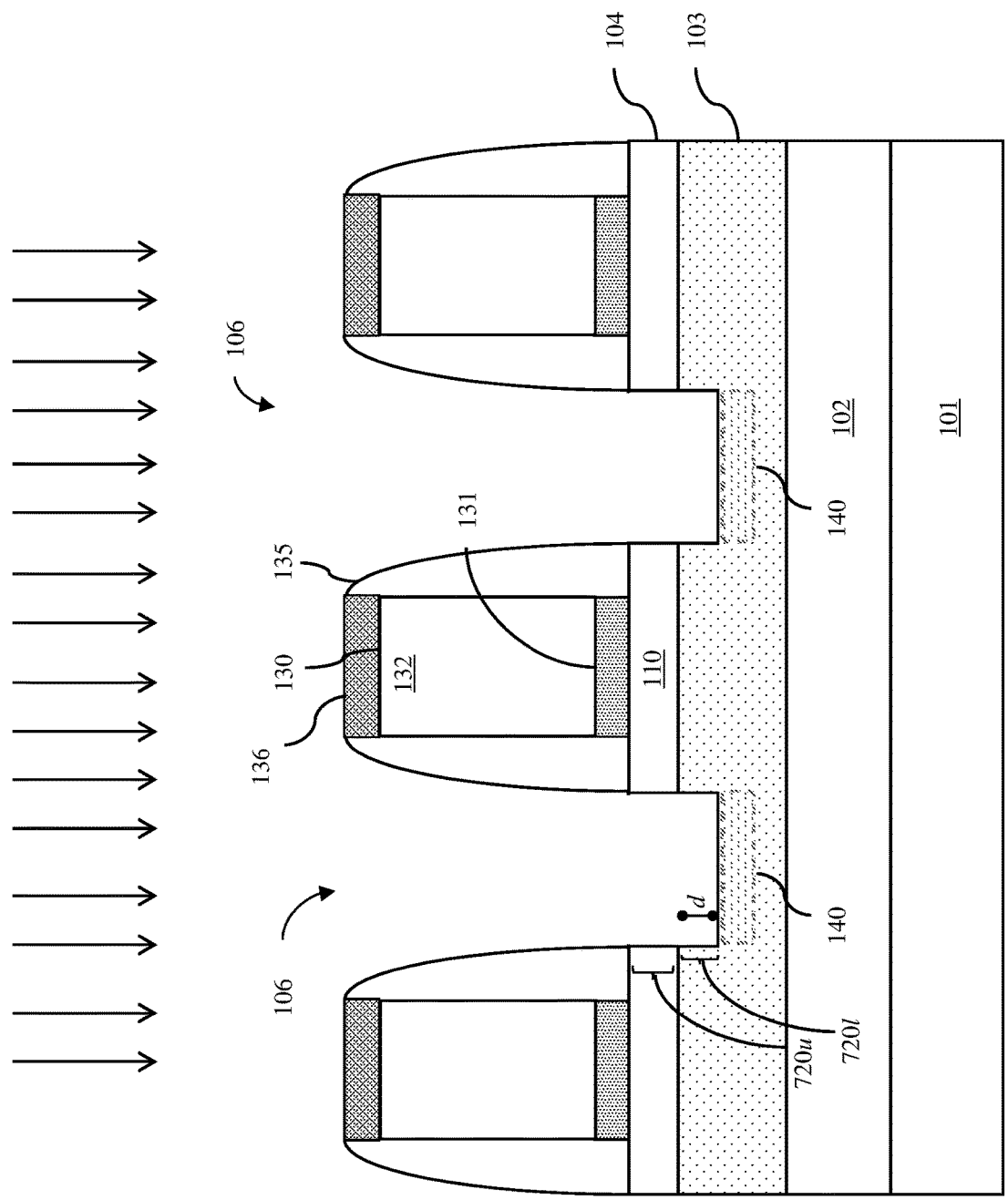
Figure 7D:
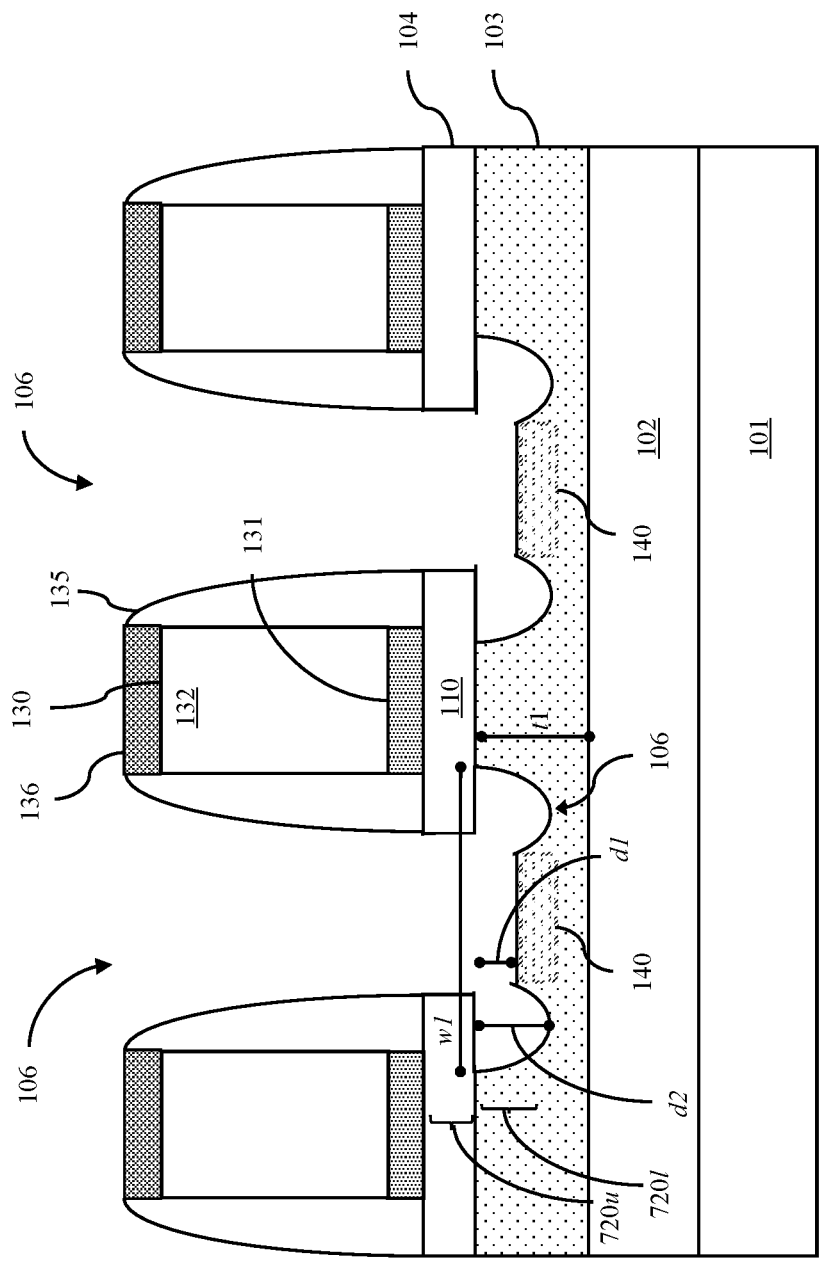

In other embodiments and, particularly, during formation of the semiconductor structures 100A of FIG. 1A and 100B of FIG. 1B, additional processing can be performed in order to expand the first portion 720*l* of each source/drain trench 106. Optionally, an etch stop region 140 can be formed in the insulator layer 103 at the bottoms of the source/drain trenches 106 (see process 312 and FIG. 7C). For example, a dopant implant process can be performed in order to implant an inert dopant into the region of the insulator layer 103 just below the bottoms of the source/drain trenches 106. The inert dopant can be selected to sufficiently change the etch characteristics of the etch stop region 140 relative to the remainder of the insulator layer 103. Additionally, this inert dopant can be selected so that the electrical characteristics of the etch stop regions 140 are not significantly different from the electrical characteristics of the remainder of the insulator layer. In some exemplary embodiments, the inert dopant can be helium, carbon or nitrogen. Next, a selective isotropic etch process can be performed to expand the size of the first portions 720*l* of the source/drain trenches 106 (see process 314 and FIG. 7D). This etch process can be selective for the undoped insulator material over the doped insulator material of the etch stop region. As a result, the sections of the first portions 720*l* of the source/drain trenches 106 aligned directly below the second portions 720*u* are not further etched, but the sides are. Furthermore, since the etch process is isotropic, the sides are etched in all directions and not just laterally, as illustrated.

The method embodiments can further include forming source/drain regions 120, 220 filling and, optionally, overfilling the source/drain trenches 106, 206 such that the channel region 110, 210 is positioned laterally between the source/drain regions 120, 220 (see process 316). Specifically, one or more layers of in situ doped epitaxial semiconductor material can be deposited so as to fill and, optionally, overfill the source/drain trenches 106, 206, thereby forming the source/drain regions 120, 220. As mentioned above, the source/drain regions 120, 220 can be N+ source/drain regions for an NFET or P+ source/drain regions for a PFET.

Figure 8:
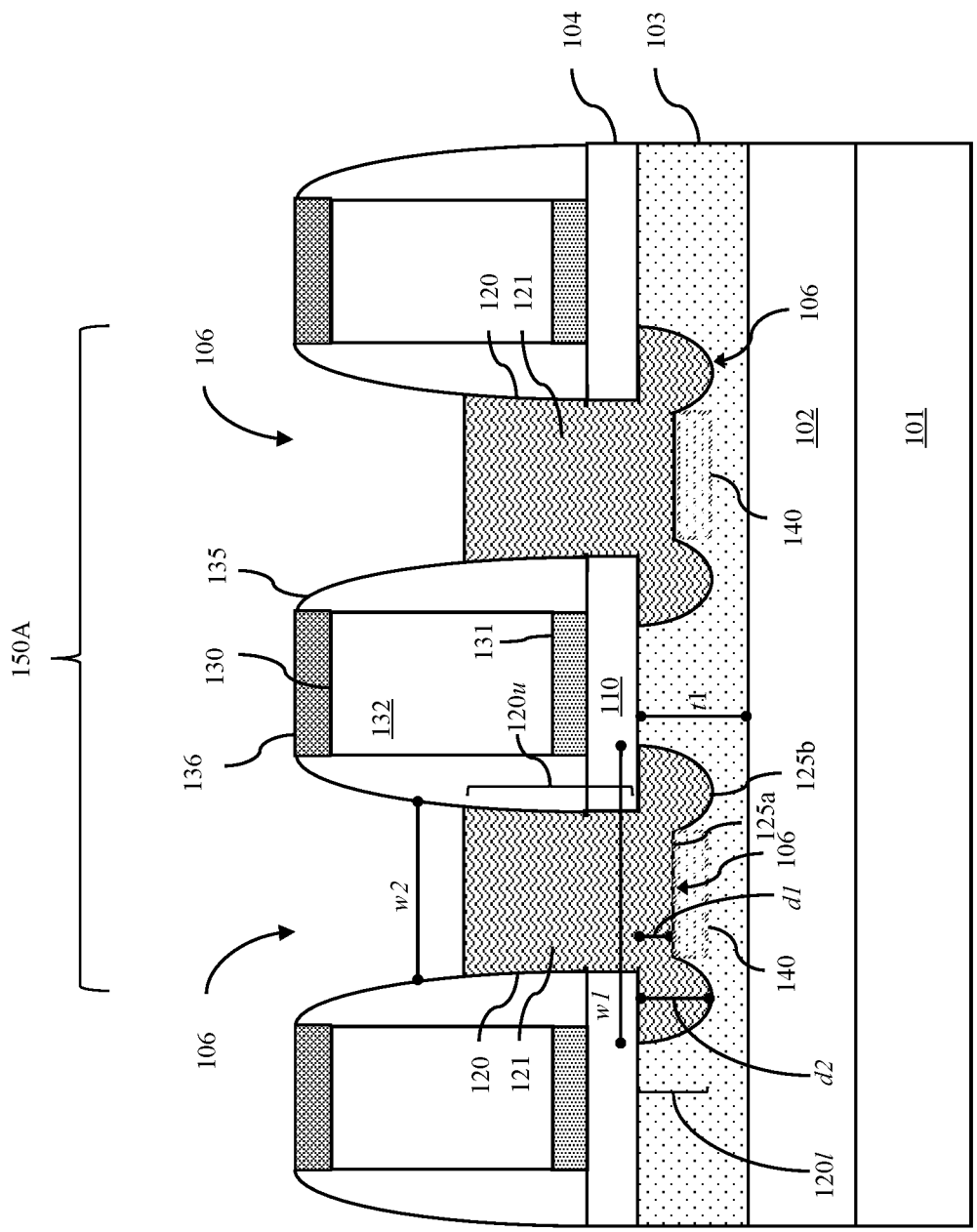
FIG. 8 is a cross-section diagram illustrating a partially completed semiconductor structures formed according to the flow diagram of FIG. 3 and showing source/drain region formation for the semiconductor structure of FIG. 1A only.

In some embodiments, to form the source/drain regions 120 at process 316, a layer of monocrystalline semiconductor material 121 can be in situ doped and concurrently and selectively epitaxially grown from exposed vertical surfaces of the semiconductor layer within each trench (e.g., see process 318 and FIG. 8, which is specifically a partially completed structure formed during the fabrication of the semiconductor structure 100A of FIG. 1A). The epitaxial growth process can continue until the source/drain trenches are completely filled and, optionally, until they are overfilled (i.e., forming raised source/drain regions). The semiconductor material 121 can be, for example, monocrystalline silicon or any other suitable monocrystalline semiconductor material.

Figure 9:
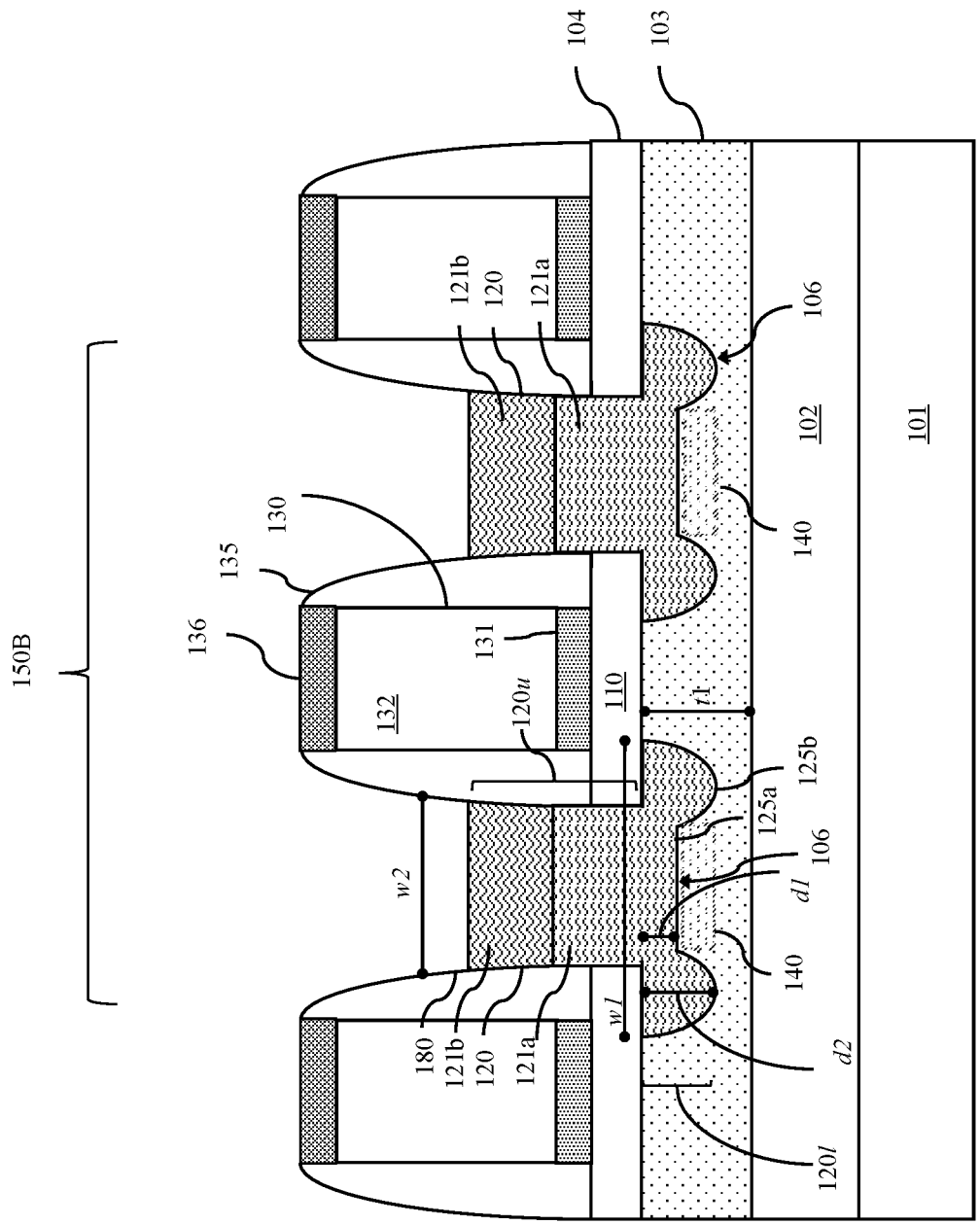
FIG. 9 is a cross-section diagram illustrating a partially completed semiconductor structures formed according to the flow diagram of FIG. 3 and showing source/drain region formation for the semiconductor structure of FIG. 1B only.
Figure 10:
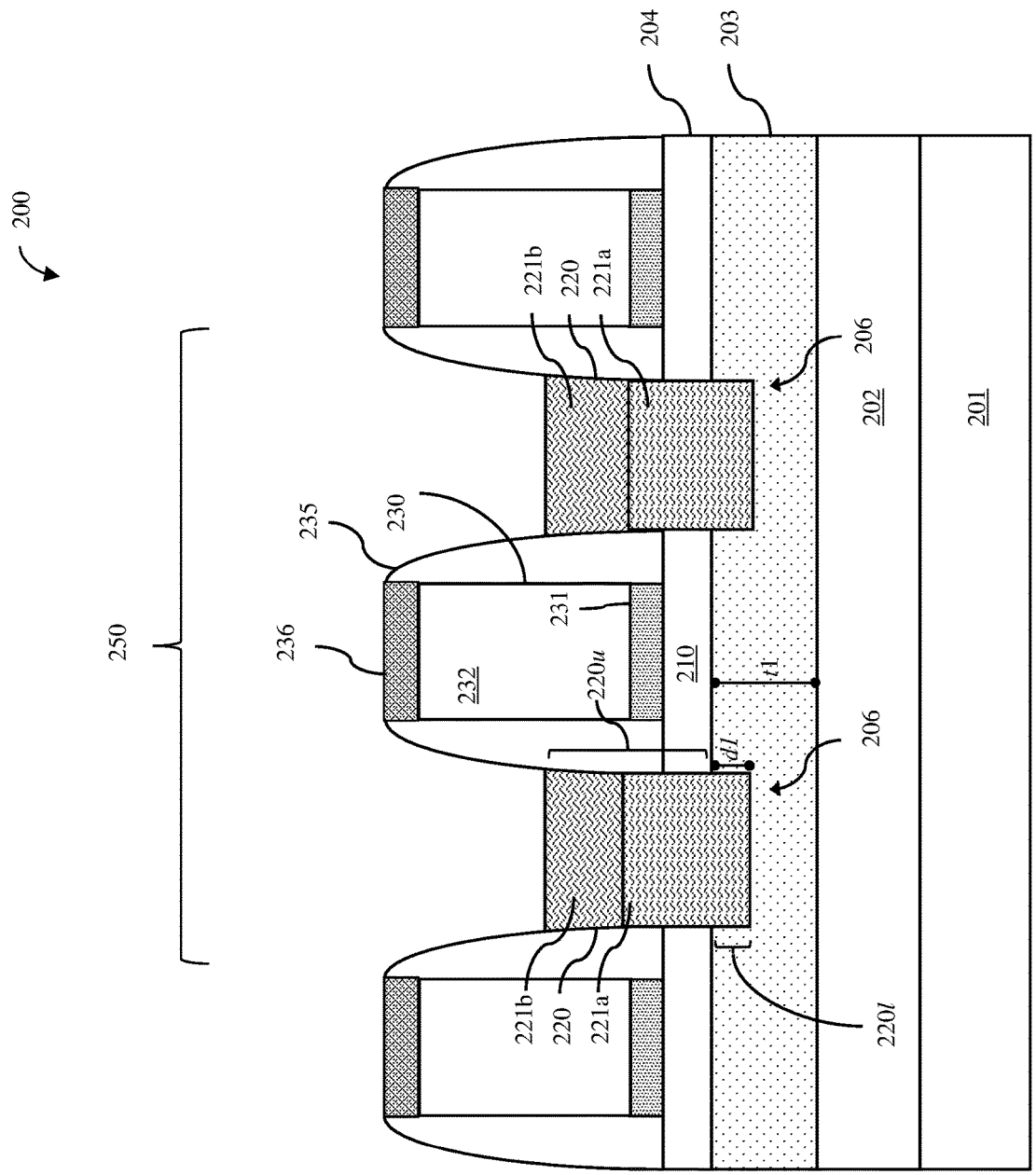
FIG. 10 is a cross-section diagram illustrating a partially completed semiconductor structures formed according to the flow diagram of FIG. 3 and showing source/drain region formation for the semiconductor structure of FIG. 2 only.

In other embodiments, to form the source/drain regions 120, 220 at process 316, a layer of a monocrystalline first semiconductor material 121*a*, 221*a* can be in situ doped and concurrently selectively epitaxially grown from exposed vertical surfaces of the semiconductor layer 104, 204 within each trench and a layer of a monocrystalline second semiconductor material 121*b*, 221*b*, which is different from the first semiconductor material 121*a*, 221*a*, can be in situ doped and concurrently selectively epitaxially grown on the first semiconductor material 121*a*, 221*a* within each trench (see processes 320-322 and FIG. 9, which is specifically a partially completed structure formed during the fabrication of the semiconductor structure 100B of FIG. 1B, or FIG. 10, which is a partially completed structure formed during the fabrication of the semiconductor structure 200 of FIG. 2). In these embodiments, the first semiconductor material 121*a*, 221*a* can, for example, be a stress-inducing semiconductor material configured to improve charge carrier mobility within the channel region 110, 210. In the case of an NFET, the first semiconductor material 121*a*, 221*a* could be a tensile stress-inducing semiconductor material configured to improve electron mobility within the channel region 110, 210. Such a tensile stress-inducing semiconductor material could be, for example, silicon carbide or some other suitable tensile stress-inducing semiconductor material. In the case of a PFET, the first semiconductor material 121*a*, 221*a* could be a compressive stress-inducing semiconductor material configured to improve hole mobility within the channel region 110, 210. Such a compressive stress-inducing semiconductor material could be, for example, silicon germanium or some other suitable tensile stress-inducing semiconductor material. In any case, the second semiconductor material 121*b*, 221*b* could be silicon or some other suitable semiconductor material.

It should be understood that by depositing epitaxial semiconductor material(s) so as to fill and, optionally, overfill the source/drain trenches 106, 206, the resulting source/drain regions 120, 220 will take on the shapes of those source/drain trenches 106, 206. Thus, the source/drain regions 120, 220 will have the shapes/features detail above with regard to the semiconductor structure embodiments and illustrated in the figures.

Additional processing can subsequently be performed in order to complete the semiconductor structures 100A of FIG. 1A, 100B of FIG. 1B or 200 of FIG. 2 (see process 330). The additional processing can include, for example, replacement metal gate (RMG) processing, if a sacrificial gate structure was previously formed at process 304. The additional processing can optionally include formation of metal silicide layers 180, 280 on the source/drain regions 120, 220 and optionally on the gate structure 130, 230. The silicide layers 180, 280 could be, for example, CoSi, NiSi, WSi, TiSi, etc. formed using conventional silicide formation techniques. The additional processing can further include deposition of one or more dielectric layers 107, 207 over the FET 150A, 150B, 250. The dielectric layers 107, 207 could include, for example, a thin conformal silicon nitride layer and a blanket silicon dioxide layer on the silicon nitride layer. Alternatively, some other suitable dielectric layer(s) 107, 207 could be formed. The additional processing can also include formation of middle of the line (MOL) contacts to the gate structure 130, 230, to source/drain regions 120, 220, and optionally, to the well region 102, 202 (not shown).

For purposes of this disclosure, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

As mentioned above, the FET 150A, 150B, 250 can be an NFET (e.g., with an intrinsic or P− channel region positioned laterally between N+ source/drain regions 120, 220 and a gate structure 130, 230 on the channel region 110, 210) or, alternatively, a PFET (e.g., with an intrinsic or N− channel region positioned laterally between P+ source/drain regions 120, 220 and a gate structure 130, 230 on the channel region 110, 210). In either case, any suitable gate structure 130, 230 could be employed. For example, the gate stack of the gate structure 130, 230 could be a gate-first polysilicon gate stack, which includes, for example: a silicon dioxide gate dielectric layer; a doped polysilicon gate conductor layer on the silicon dioxide gate dielectric layer; and, optionally, a metal silicide layer 180, 280 (e.g., CoSi, NiSi, WSi, TiSi, or any other suitable metal silicide material layer) on the doped polysilicon gate conductor layer. Alternatively, the gate stack of the gate structure 130, 230 could be a gate-first high-K metal gate (HKMG) stack, which includes, for example: an interfacial layer (e.g., a silicon oxynitride layer) on the semiconductor layer; a high-K gate dielectric layer (i.e., a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; one or more stacked metal layers (e.g., a metal capping layer and an additional metal material layer suitable for dipole formation on the metal capping layer) on the high-K gate dielectric layer; an optional doped polysilicon gate conductor layer on the metal gate conductor layer(s); and an optional metal silicide layer 180, 280, as discussed above, on the doped poly silicon gate conductor layer. Alternatively, the gate stack of the gate structure 130, 230 could be any other suitable type of gate stack (e.g., a replacement metal gate (RMG) structure), which includes, for example: a high-K gate dielectric layer; a work function metal layer on the high-K gate dielectric layer; an optional doped polysilicon gate conductor layer on the work function metal layer; and an optional metal silicide layer 180, 280, as discussed above, on the doped polysilicon gate conductor layer.

Various different gate-first and replacement gate structures are known in the art and, thus, the details of such gate structures have been omitted from this specification in order to allow the reader to focus on the salient aspects of the disclosed embodiments. However, as discussed above, those skilled in the art will recognize that the configuration of the gate stack of the gate structure 130, 230 can vary depending upon whether the FET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)). In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation. In an RMG, the desired effective work function can be achieved, for example, using different work function metal layers immediately adjacent to the high-K gate dielectric layer. Exemplary metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Exemplary metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Such gate structures and the techniques for forming them are well known in the art and, thus, the details thereof have been omitted from this specification in order to allow the reader to focus on the salient aspects of the disclosed embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   an insulator layer;
   a semiconductor layer on the insulator layer; and
   a transistor comprising:
      source/drain regions extending through the semiconductor layer and into the insulator layer; and
      a channel region in the semiconductor layer positioned laterally between the source/drain regions,
      wherein each source/drain region has a first portion within the insulator layer and a second portion within the semiconductor layer,
      wherein the first portion has an end section adjacent to the channel region, and an additional section positioned laterally adjacent to the end section and further aligned below the second portion,
      wherein the additional section extends a first depth into the insulator layer and the end section extends a second depth into the insulator layer,
      wherein the second depth is greater than the first depth, and
      wherein the semiconductor layer extends laterally over the end section of the first portion to the second portion.

2. The structure of claim 1, wherein the insulator layer comprises an etch stop region aligned below the additional section.

3. The structure of claim 2, wherein the etch stop region comprises an inert dopant.

4. The structure of claim 2, wherein the etch stop region comprises any of helium, carbon and nitrogen.

5. The structure of claim 1, further comprising:
   a gate structure on the semiconductor layer adjacent to the channel region; and
   gate sidewall spacers positioned laterally adjacent to opposing sides of the gate structure,
   wherein, within each source/drain region, the second portion further extends above the semiconductor layer and is positioned laterally adjacent to a gate sidewall spacer.

6. The structure of claim 5, wherein the end section is aligned below an adjacent gate sidewall spacer.

7. The structure of claim 5, wherein the end section is aligned below an adjacent gate sidewall spacer and further extends below the gate structure.

8. The structure of claim 1, wherein each source/drain region comprises a single layer of semiconductor material.

9. The structure of claim 1, wherein each source/drain region comprises: a layer of a first semiconductor material positioned laterally immediately adjacent to the semiconductor layer and a layer of a second semiconductor material on and different from the layer of the first semiconductor material.

10. The structure of claim 9, wherein the first semiconductor material comprises a stress-inducing semiconductor material configured to improve charge carrier mobility within the channel region.

11. A structure comprising:
    an insulator layer;
    a semiconductor layer on the insulator layer; and a transistor comprising:
  source/drain regions extending through the semiconductor layer and into the insulator layer; and
  a channel region in the semiconductor layer positioned laterally between the source/drain regions,
  wherein each source/drain region comprises: a first semiconductor material positioned laterally immediately adjacent to the semiconductor layer and the insulator layer; and a second semiconductor material on and different from the first semiconductor material, and
  wherein the first semiconductor material comprises a stress-inducing semiconductor material configured to improve charge carrier mobility within the channel region.

12. A method comprising:
accessing a semiconductor layer on an insulator layer; and
forming a transistor comprising:
  source/drain regions extending through the semiconductor layer and into the insulator layer; and
  a channel region in the semiconductor layer positioned laterally between the source/drain regions,
  wherein each source/drain region has a first portion within the insulator layer and a second portion within the semiconductor layer,
  wherein the first portion has an end section adjacent to the channel region, and an additional section positioned laterally adjacent to the end section and further aligned below the second portion,
  wherein the additional section extends a first depth into the insulator layer and the end section extends a second depth into the insulator layer,
  wherein the second depth is greater than the first depth, and
  wherein the semiconductor layer extends laterally over the end section of the first portion to the second portion.

13. The method of claim 12, wherein the forming of the transistor comprises:
  forming a gate structure on the semiconductor layer;
  forming gate sidewall spacers adjacent to opposing sidewalls of the gate structure; and
  forming source/drain trenches adjacent to the gate sidewall spacers, respectively, wherein the forming of the source/drain trenches comprises:
    performing a selective anisotropic etch process to etch the source/drain trenches through the semiconductor layer;
    performing an additional selective anisotropic etch process to extend the source/drain trenches into the insulator layer;
    forming etch stop regions in the insulator layer below the source/drain trenches; and
    performing a selective isotropic etch process to widen the source/drain trenches within the insulator layer.

14. The method of claim 13, wherein the forming of the etch stop regions comprises implanting an inert dopant into the insulator layer at bottoms of the source/drain trenches.

15. The method of claim 14, wherein the inert dopant comprises any of helium, carbon and nitrogen.

16. The method of claim 13, further comprising performing at least one selective in situ doped epitaxial semiconductor growth process to form the source/drain regions within the source/drain trenches and further extending above the semiconductor layer so as to be positioned laterally adjacent to the gate sidewall spacers.

17. The method of claim 16, wherein the performing of the at least one selective in situ doped semiconductor growth process comprises:
  growing a first semiconductor material laterally from the semiconductor layer; and
  growing a second semiconductor material on the first semiconductor material, wherein the first semiconductor material and the second semiconductor material comprise different semiconductor materials.

18. The method of claim 17, wherein the first semiconductor material comprises a stress-inducing semiconductor material configured to improve charge carrier mobility within the channel region.

* * * * *